(12) United States Patent
Buzi et al.

(10) Patent No.: US 12,471,293 B2
(45) Date of Patent: Nov. 11, 2025

(54) IN-SITU LOW TEMPERATURE DIELECTRIC DEPOSITION AND SELECTIVE TRIM OF PHASE CHANGE MATERIALS

(71) Applicant: International Business Machines Corporation, Armonk, NY (US)

(72) Inventors: Luxherta Buzi, Chappaqua, NY (US); Hiroyuki Miyazoe, White Plains, NY (US); Henry K. Utomo, Ridgefield, CT (US); Matthew Peter Sagianis, Bayside, NY (US)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 17/544,993

(22) Filed: Dec. 8, 2021

(65) Prior Publication Data

US 2023/0180487 A1    Jun. 8, 2023

(51) Int. Cl.
   *H10B 63/00*    (2023.01)
   *H10B 63/10*    (2023.01)
   (Continued)

(52) U.S. Cl.
   CPC ............. *H10B 63/24* (2023.02); *H10B 63/10* (2023.02); *H10B 63/30* (2023.02);
   (Continued)

(58) Field of Classification Search
   CPC .... H10N 70/00; H10N 70/231; H10N 70/826; H10N 70/8828; H10N 70/063;
   (Continued)

(56) References Cited

U.S. PATENT DOCUMENTS 7,575,950 B2   8/2009  Shiba
7,608,503 B2  10/2009  Lung et al.
(Continued)

FOREIGN PATENT DOCUMENTS

KR    10-1339400 B1    12/2013

*Primary Examiner* — Eliseo Ramos Feliciano
*Assistant Examiner* — Brad A Knudson
(74) *Attorney, Agent, or Firm* — Scully, Scott, Murphy & Presser, P.C.; L. Jeffrey Kelly, Esq.

(57) ABSTRACT

A method of fabricating a resistive semiconductor memory structure that provides in-situ selective etch of phase change materials during deposition of dielectric at low temperature (in the same chamber). The method provides, to a single processing chamber, a semiconductor wafer including a trimmed resistive memory device structure having one or more layers of phase change material used to form a resistive memory device. The one or more layers of phase change material have oxidized sidewall surfaces as a result of a prior etching step where a whole stack structure of the layers forming the resistive memory structure is etched. Then, an encapsulating of the trimmed resistive memory device structure is performed by depositing, within the processing chamber, using a PECVD, a layer of dielectric material, and during the encapsulating, etching, within the processing chamber, the wafer to selectively remove the phase change material oxidation at the sidewall surfaces.

9 Claims, 6 Drawing Sheets

(51) Int. Cl.
*H10N 70/00* (2023.01)
*H10N 70/20* (2023.01)
*C23C 16/455* (2006.01)

(52) U.S. Cl.
CPC ......... *H10N 70/063* (2023.02); *H10N 70/231* (2023.02); *H10N 70/826* (2023.02); *H10N 70/8828* (2023.02); *C23C 16/45536* (2013.01); *H10B 63/82* (2023.02)

(58) Field of Classification Search
CPC ........ H10B 63/24; H10B 63/10; H10B 63/30; H10B 63/82
See application file for complete search history.

(56) References Cited

U.S. PATENT DOCUMENTS

| | | | |
|---|---|---|---|
| 7,642,123 B2 | 1/2010 | Lung | |
| 10,312,437 B2 | 6/2019 | Liu | |
| 2006/0169968 A1 | 8/2006 | Happ | |
| 2017/0033282 A1* | 2/2017 | Wang | H10N 50/01 |
| 2020/0152870 A1* | 5/2020 | Lin | H10N 70/8828 |
| 2021/0193736 A1* | 6/2021 | Seong | H10N 70/828 |
| 2021/0313513 A1* | 10/2021 | Lutker-Lee | H10N 70/841 |
| 2022/0020817 A1* | 1/2022 | Yang | H10N 70/8828 |
| 2022/0344582 A1* | 10/2022 | Lin | H10N 70/841 |
| 2022/0407000 A1* | 12/2022 | Yang | H10N 70/8616 |

* cited by examiner

IN-SITU LOW TEMPERATURE DIELECTRIC DEPOSITION AND SELECTIVE TRIM OF PHASE CHANGE MATERIALS

BACKGROUND

The present disclosure relates generally to semiconductor memory cells and methods of forming the same. More particularly, the present application relates to non-volatile phase change memory cells and methods of forming such cells.

Non-volatile memory and volatile memory are two major groups of computer memory. Constant input of energy is required to retain information in volatile memory devices, but not in non-volatile memory devices. Examples of non-volatile memory devices include Read Only Memory, Flash Electrical Erasable Read Only Memory, Ferroelectric Random Access Memory, Magnetic Random Access Memory and Phase Change Memory. Examples of volatile memory include Dynamic Random Access Memory (DRAM) and Static Random Access Memory (SRAM).

One type of non-volatile memory that has been growing in recent years is Phase Change Memory (PCM). In PCM, information is stored in materials that can be manipulated into different phases, e.g., the amorphous phase and the crystalline phase. Such materials are referred to as phase change materials. The amorphous phase and the crystalline phase are typically two phases used for bit storage (1's and 0's) since they have two detectable differences in electrical resistance. Notably, the amorphous phase has a higher resistance than the crystalline phase.

Glass chalcogenides are a group of materials commonly utilized as phase change materials. The aforementioned group of materials contains a chalcogen (i.e., an element from Group 16 of the Periodic Table of Elements) and a more electropositive element. Selenium (Se) and tellurium (Te) are the two most common semiconductors in the group used to produce a glass chalcogenide when creating a phase change memory cell. Examples of this include $Ge_2Sb_2Te_5$ (GST), SbTe, and $In_2Se_3$. However, some phase change materials do not utilize a chalcogen but still can be used in such memory cells. Thus, a variety of materials can be used in a PCM cell so long as the material can retain separate amorphous and crystalline states.

Some PCM cells may include a material stack of, from bottom to top, a bottom electrode, a phase change memory material and a top electrode.

During the manufacture of PCM cells, it is the case that phase change materials can be sensitive to air exposure or reactive ion etch (RIE) process damage. A separate clean step is needed to remove RIE residue and the damaged layer. Materials need to be encapsulated immediately to minimize air exposure. Phase change materials are further sensitive to high temperature processes, so the cleaning and encapsulation must be done at low temperature.

Current solutions addressing this problem include: 1) the maintaining of the queue time between RIE, clean, and encapsulation; or 2) in-situ RIE and in-vacuo encapsulation without clean between RIE and deposition.

SUMMARY

A method of fabricating a semiconductor device such as a resistive random access memory (RRAM) device. In embodiment, the RRAM device includes a Phase Change Memory (PCM) material.

In an embodiment, the method for manufacturing a PCM memory cell on a wafer includes allowing in-situ selective etch of phase change materials during deposition of dielectric at a low temperature (in the same chamber).

In this embodiment, the plasma etch parameters are tuned during encapsulation to enable simultaneously (as an in-situ process): selectively etch PCM material (e.g., GST) and control encapsulating dielectric material (e.g., SiN) deposition.

In an embodiment, there is provided a method of fabricating a resistive memory semiconductor device. The method of fabricating comprises: providing, within a processing chamber, a semiconductor wafer including a trimmed resistive memory device structure having one or more layers of phase change material used to form a resistive memory device, the one or more layers of phase change material having oxidized sidewall surfaces; and encapsulating the trimmed resistive memory device structure by depositing, within the processing chamber, a layer of dielectric material, and during the encapsulating, etching, within the processing chamber, the wafer to selectively remove the oxidized sidewall surfaces of said phase change material.

In an embodiment, a resistive memory semiconductor device structure is provided. The resistive memory semiconductor device comprises: a bottom electrode; an organic material layer formed above the bottom electrode; a switching material layer formed above the organic material layer; a first intermediate barrier layer formed above the switching material layer; a phase change material layer formed above the first intermediate barrier layer; a second intermediate barrier layer formed above the phase change material layer; and a top electrode formed above the second intermediate barrier layer, wherein a width of the switching material layer and a width of the phase change material layer is reduced relative to a width of each first intermediate barrier layer and a width of the second intermediate barrier layer.

In an embodiment, there is provided a method of fabricating a stacked resistive semiconductor memory device structure. The method comprises: providing, within a first processing chamber, a semiconductor wafer including a stack of material layers, the stack of material layers having one or more layers of phase change material used to form a resistive memory device; etching, within the first processing chamber, the wafer to form a trimmed resistive memory device structure, the etching resulting in forming an oxidation of phase change material at each sidewall surfaces of the trimmed resistive memory device structure; providing, to a second processing chamber, the semiconductor wafer including the trimmed resistive memory device structure with the one or more layers of phase change material having oxidized sidewall surfaces; and encapsulating the trimmed resistive memory device structure by depositing, within the second processing chamber, a layer of dielectric material, and during the encapsulating, etching, within the second processing chamber, the wafer to selectively remove the phase change material oxidation at the sidewall surfaces.

In an embodiment, the method comprises a transferring of the wafer in-vacuo between the first processing chamber and the second processing chamber to perform simultaneous GST trim and dielectric layer encapsulation.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
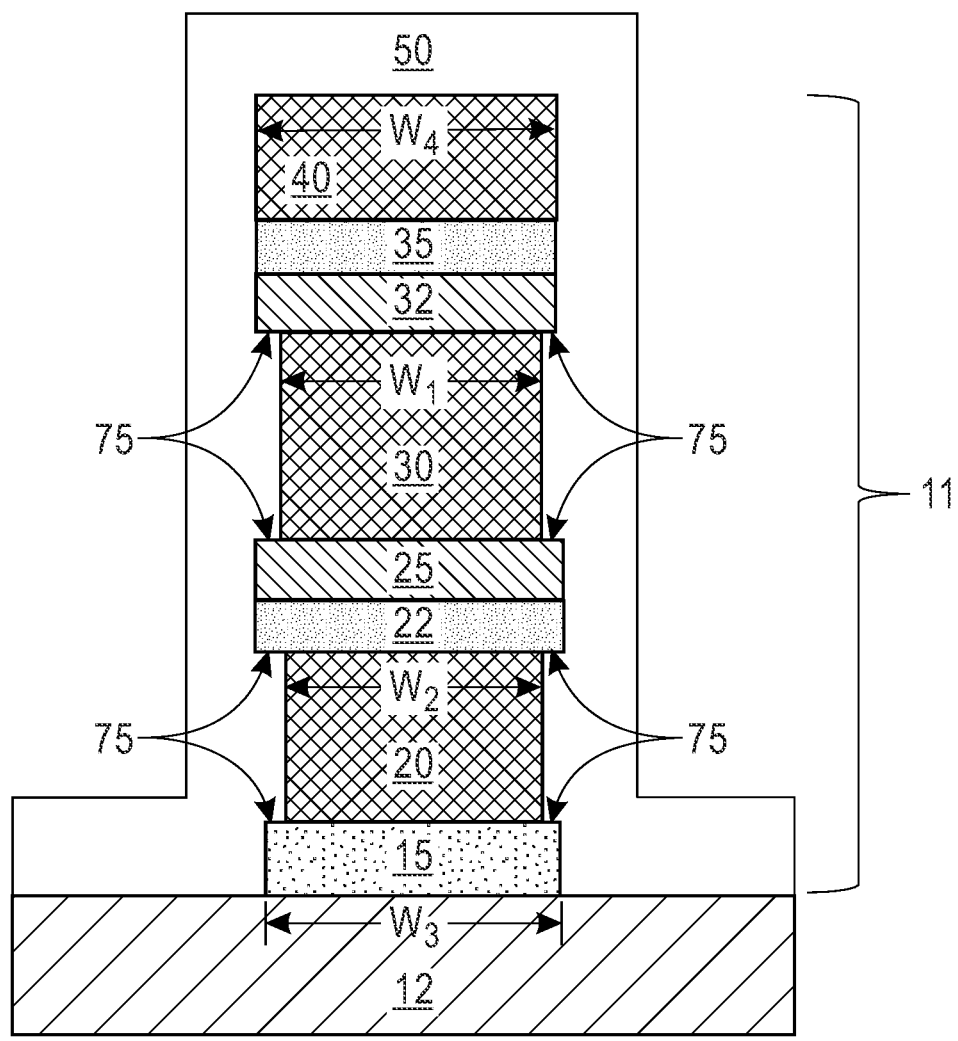
FIG. 1 depicts a side cross-sectional view of a resistive memory device in accordance with a non-limiting embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In one embodiment, the present invention provides a method and structure for forming PCM memory cells on a semiconductor wafer.

As used herein, a "phase change memory cell" means a structure including at least one phase change material that is interposed between two contacts, where at least a portion of the phase change material can be switched from an amorphous state into a crystalline state, and vise-versa, by application of energy, wherein the crystalline state has a lower resistivity than the amorphous state.

FIG. 1 depicts a PCM memory device 10 in accordance with the present embodiment. As shown, the PCM memory device is arranged as a column or memory cell pillar structure 11, and although one PCM memory device 10 is shown, the structure and method steps described herein can include plural PCM memory devices that can form a cross point memory array that can be, but is not limited to, part of a solid-state memory array or a solid-state drive.

In one embodiment, the PCM memory device 10 shown in FIG. 1 includes a bottom electrode (BE) layer 12, e.g., composed of a metal material such as TiN, W, Cu, TaN, C, Ru, Ir, Al, Ti, Ta. Formed on BE layer 12 is a pillar structure composed of a stack consisting of from bottom to top: an organic material layer 15 located above the bottom electrode (BE) layer 12 and composed of a material such as C, C—O; an Ovonic Threshold Switching (OTS) material layer 20 located above organic material layer 15, e.g., a chalcogenide selector material such as a-GeSex, SiTex and SiSex; a further organic material layer 22 of C, C—O material deposited on the OTS switching layer 20 and an interface barrier metal layer 25 composed of material such as C, C—O, W, Ti, Ta, Ru is deposited on the organic material layer 22; a layer 30 of phase change material such as GST is located above interface barrier metal layer 25. The GST layer 30 is composed of a phase change material containing Ge, Sb, and Te materials. Further in the stack of FIG. 1, a further interface barrier metal layer 32 is deposited on the GST layer 30 and an organic material layer 35 of C, C—O material is deposited on interface barrier metal material layer 32, e.g., C, C—O, W, Ti, TiN, Ta, TaN, Ru, Ir, Al. A top electrode (TE) layer 40 of a metal material is formed on the organic material layer 35. An insulative encapsulation layer 50 encapsulates the memory cell pillar structure 11.

As shown in FIG. 1, the layer 30 of phase change material layer, e.g., GST layer 30 is of a singular width $W_1$, while the OTS material layer 20 is of a second width $W_2$. Organic material layer 15 is of a width $W_3$, while TE layer 40 is of a width $W_4$. In an embodiment, the widths $W_1$, $W_2$ are substantially equal, e.g., resulting from a self-aligned forming process. In an embodiment, the bottom and top electrode widths $W_3$, $W_4$ are substantially equal and the widths $W_1$, $W_2$ are of reduced critical dimension (CD) relative to the widths $W_3$, $W_4$ and reduced relative to widths of remaining layers 12, 15, 22, 25, 32, 35.

As shown in the PCM cell structure 10 shown in FIG. 1, there is formed, as a result of the applied process steps in which GST sidewall RIE/trim and encapsulation are done in-situ while maintaining selectivity to other elements in the stack and while controlling GST ambient exposure, similar undercuts 75 on the top GST layer 40 and bottom OTS layer 30 resulting from the trimming. That is, the method of forming the PCM cell structure of FIG. 1 utilizes an in-situ plasma etch and encapsulation process which has selectivity tuned to enable GST/OTS undercuts 75, while simultaneously enabling SiN (in-situ) encapsulation. As a result of the process steps described herein below, the GST layers 20 and 40 are subject to no structural damage, no oxidation, no residue, and are of a good elemental composition.

Figure 2A:
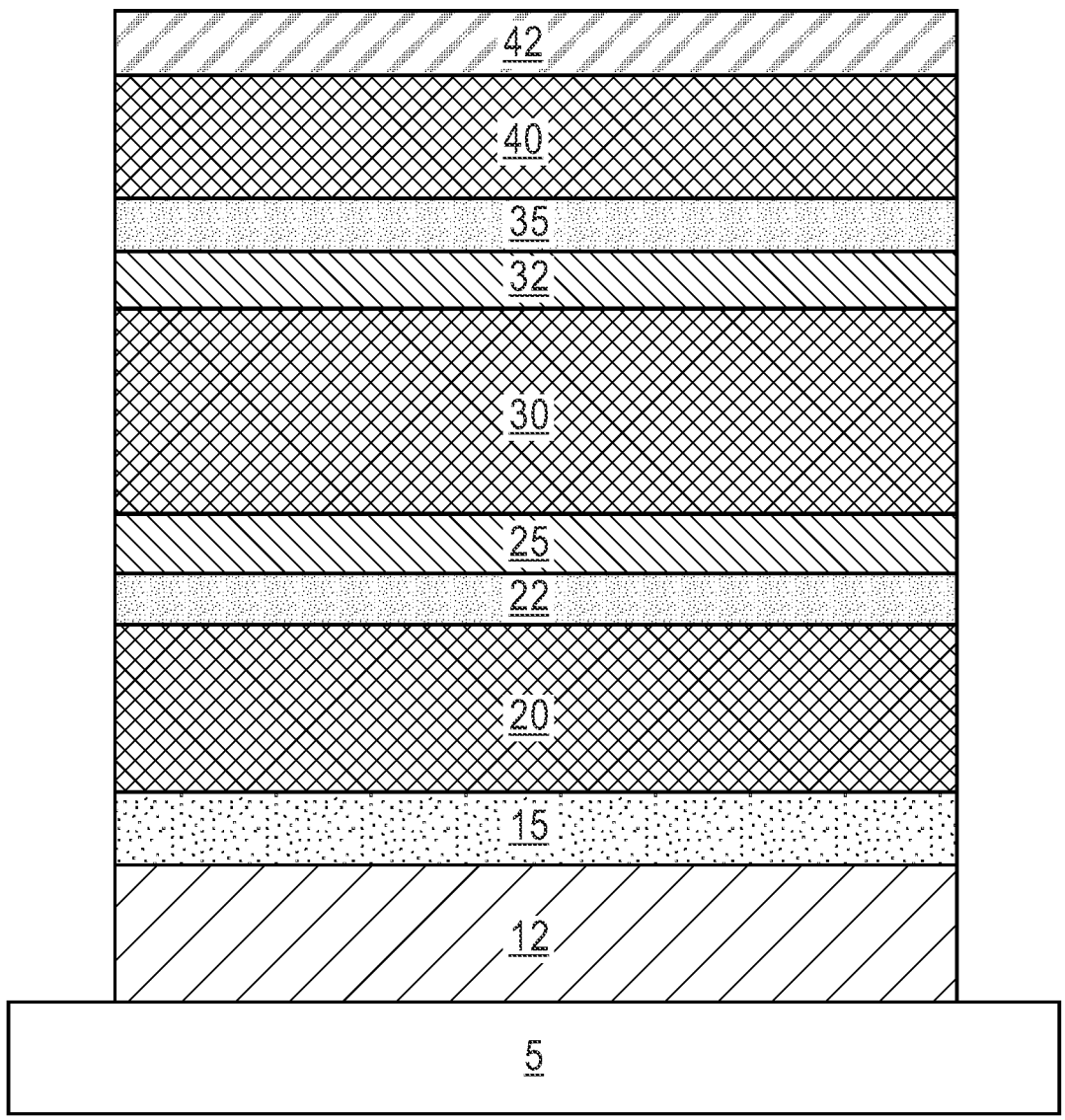
FIGS. 2A-2D depict a series of side cross-sectional views illustrating one embodiment of a method for manufacturing the resistive memory device of FIG. 1.
Figure 2B:
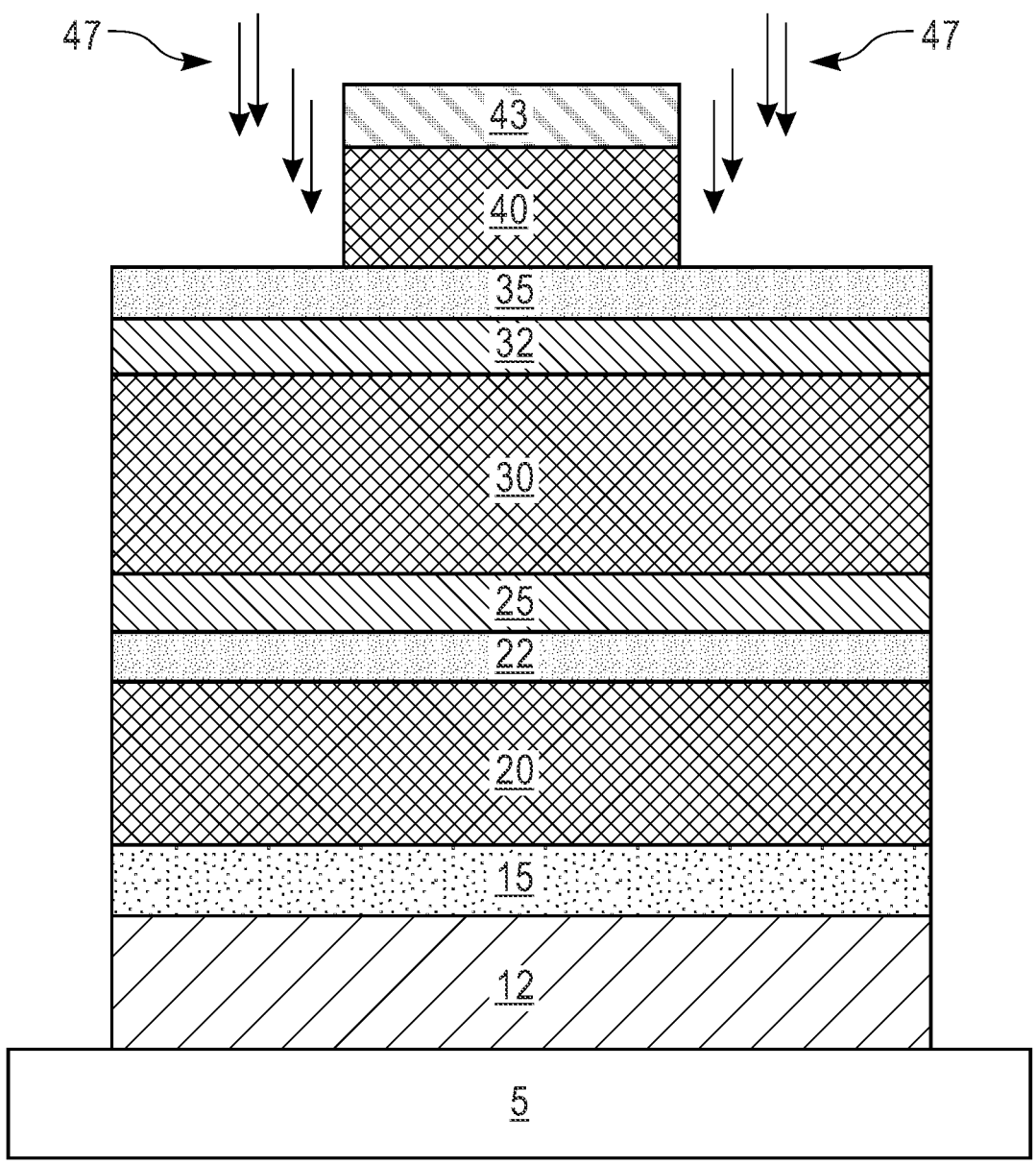
Figure 2C:
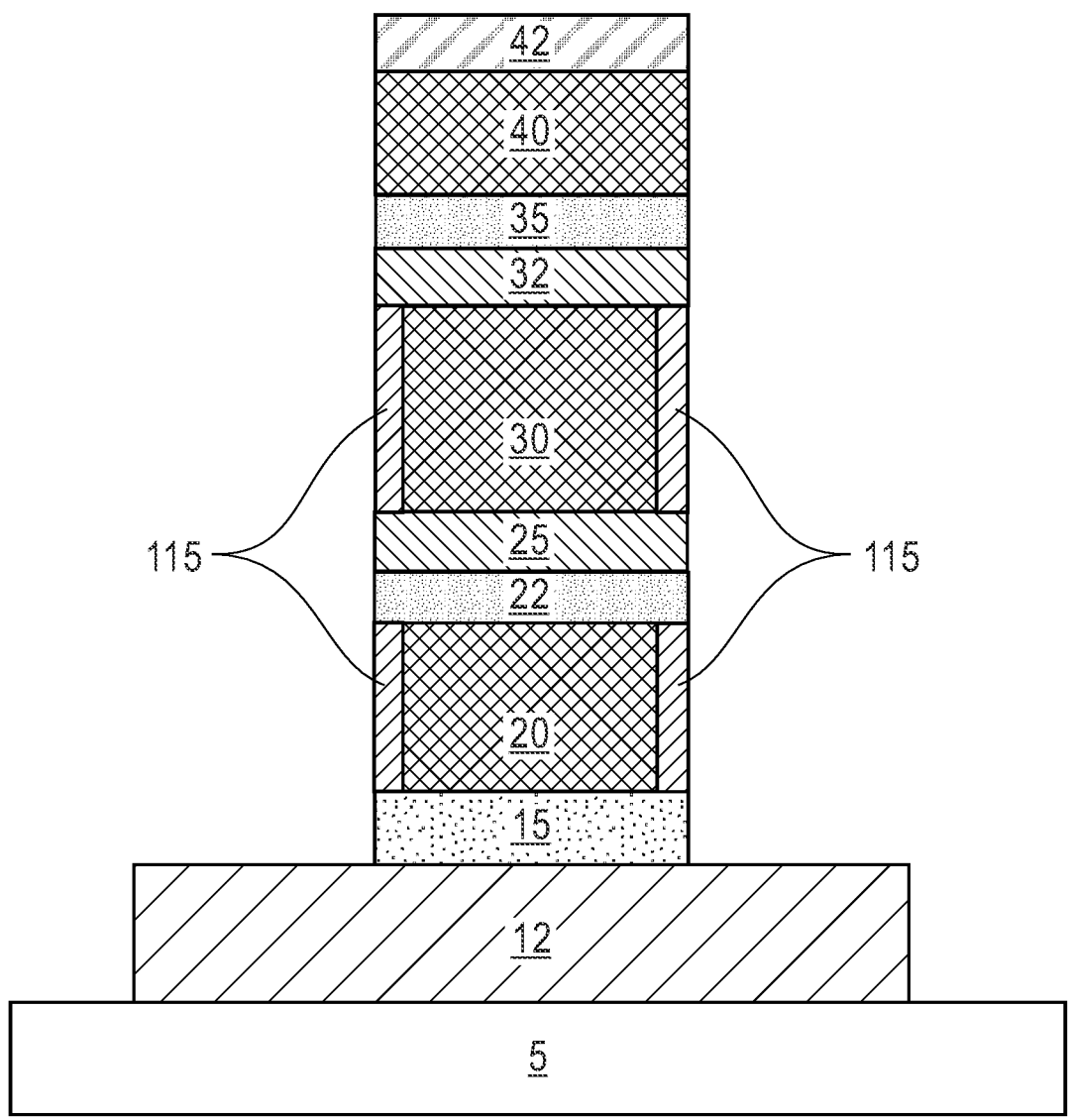

FIGS. 2A-2C depict one embodiment of a method for manufacturing a memory device of FIG. 1.

FIG. 2A depicts one embodiment of a first dielectric layer 5 including at least one conductive structure (not shown) such as an electrically conductive structure, that is positioned atop a substrate (not shown) and formed on a semiconductor wafer. In one embodiment, the present method may begin following front end of the line (FEOL) processing, in which the first dielectric layer 5 is provided as part of an interlevel dielectric layer having a plurality of openings that are filled with at least one conductive material to provide conductive structures (not shown), which may include but is not limited to metal studs, landing pads and/or metal bars that are filled with a metal material such as copper, tungsten, copper alloy, cobalt, or any suitable conducting metals. Such an interlevel dielectric layer may be formed of interlevel low-k dielectric (ILD) or Tetraethyl orthosilicate (TEOS) materials.

In one embodiment, the first dielectric layer 5 may include a conductive structure (not shown) that provides electrical conductivity to a first terminal (source/drain) of a select/access transistor (not shown) that is formed in the underlying substrate. In one embodiment, the first dielectric layer (not shown) may also include at least one metal bar, wherein the metal bar is a conducting line that may be used to provide electrical conductivity to the second (source/drain) terminal of an select/access transistor (not shown) positioned in the underlying substrate.

FIG. 2A illustrates the results of the initial processing steps that produce a stacked memory device structure on a semiconductor wafer during Back-end-of-Line (BEOL) semiconductor manufacturing processes. FIG. 2A particularly shows a cross-section view of an intermediate semiconductor structure 100 resulting from BEOL manufacturing processes in which the structure includes a stack of successive layers formed by deposition processes. A first deposition process forms bottom electrode layer 12 composed of a metal material deposited upon a bottom conductive landing pad structure (not shown) within the interlevel low-k dielectric (ILD) or Tetraethyl orthosilicate (TEOS) material layer 5. In an embodiment, bottom electrode may comprise materials such as Ti, TiN, Ta, TaN, Ru, Ir, Al, C and W and is deposited using a chemical vapor deposition (CVD) process, Plasma-enhanced (PECVD) or phase vapor deposition (PVD) process. In an embodiment, there is then deposited an organic material layer 15 of C, C—O materials atop the bottom electrode layer 12 by deposition processes such as CVD, PECVD or PVD. Then, an access device material layer 20 is deposited upon the organic material layer 15. In an embodiment, access device 20 can be a switch, e.g., a rectifier diode, an OTS (Ovonics Threshold Switch), or any other etched 2-terminal access device enabling read or write access to the PCM memory layer. In an embodiment, access device material layer 20 is a chalcogenide (OTS) selector material deposited atop the organic material layer 15. In an embodiment, the OTS layer is deposited by to a thickness ranging between 20 nm-30 nm. The Ovonic Threshold Switch is composed of As-Se materials and is embedded in the intermediate semiconductor structure 100 with connection to an FET switching transistor, e.g., one nFET (not shown) for controlling RRAM device forming.

Then, a further organic material layer 22 is deposited atop the OTS layer 20 and an interface barrier metal layer 25 is deposited atop the organic material layer 22. In an embodiment, bottom electrode layer 12 ranges from a thickness between 100 nm-300 nm; organic material layer 15 ranges from a thickness between 5 nm-20 nm; organic material layer 22 ranges from a thickness between 5 nm-20 nm; and interface barrier metal layer 25 ranges from a thickness between 3 nm-5 nm.

The method then includes depositing a PCM material layer, e.g., a chalcogenide alloy such as germanium-antimony-tellurium (GST) material layer 30 overlying the barrier metal layer 25. In an embodiment, the phase change material layer 30 may be formed from a mixture of Gallium (Ga) and Antimony (Sb) and at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb). It is to be appreciated that the preceding list is merely illustrative and, thus, other elements can also be used to form the phase change material. The phase change material may also be made of a transition metal oxide having multiple resistance states. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO ($Pr_xCa_{1-x}MnO_3$) (where x ranges from 0 to 3). In an embodiment, the phase change material may be a chemical compound including one or more elements selected from the group consisting of sulfur(S), selenium (Se), tellurium (Te), arsenic (As), antimony (Sb), germanium (Ge), tin (Sn), indium (In), and silver (Ag). The GST layer 30 is deposited by Atomic layer deposition (ALD), CVD, or phase vapor deposition (PVD) processes to a thickness ranging from between 10 nm-200 nm.

Then, the method includes depositing a further interface barrier metallic layer 32 atop GST material layer 30. In an embodiment, barrier metallic layer 32 is composed of W, WOx (where x ranges from 0 to 3), WN, Ti, Ta, Ru and ranges from a thickness between 3 nm-5 nm. A further organic material layer 35 is deposited on the interface barrier metallic layer 32 of a metal-containing material. In an embodiment, organic material layer 35 ranges from a thickness between 5 nm-20 nm. A top electrode (TE) layer 40 of a metal material is then formed on the organic material layer 35. Top electrode is composed of a metal or metal alloy material such as TaN, Ta, TiN, W, e.g., formed by CVD processes. Further, the method includes depositing a hardmask layer 42 upon the top electrode layer 40.

FIG. 2B depicts a structure resulting from a further application of lithographic patterning and reactive ion etching (RIE) steps to remove portions of the top electrode layer 40 and hardmask layer 42 used to form self-aligned sidewalls of the PCM cell pillar structure in a subsequent full-stack RIE etch process 47 when forming the memory cell pillar structure 11 of FIG. 1. In an embodiment, hardmask 42 may be composed of an insulating material such as SiN or $SiO_2$.

For example, FIG. 2B is a cross sectional view of the structure shown in FIG. 2A after patterning the PCM-containing material stack and etching the top layers to provide an intermediate PCM memory cell structure.

In particular, a pattern is produced by applying a photoresist (not shown) to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, the hardmask 42 is used to form the top electrode layer 40.

In an embodiment, as shown in FIG. 2B, after depositing the dielectric cap or hardmask 42 atop the TE layer 40, there is performed applying a photoresist pattern to the hardmask material using a lithography process steps. The photoresist pattern is then transferred into the hardmask material using a dry etch process forming a dielectric cap 43. Next the photoresist pattern is removed and a single etch or multiple etching 47 can be used to trim the width of the intermediate semiconductor structure 100 defined by the width of the dielectric cap 43 to form self-aligned PCM stacked cell structure having trimmed sidewalls as shown in FIG. 2C. In an embodiment, a RIE (reactive ion etching) etch process 47 selective to the top surface of the BE layer 128 can be performed. The etching is performed using RIE in an etch vacuum chamber, where the intermediate semiconductor structure 100 on the wafer is etched, landing on the bottom electrode layer 12. In an embodiment, the critical dimension (CD) of the PCM cell feature is 40 nm-150 nm in diameter. The dielectric cap 43 may then be removed by a wet or dry etch.

FIG. 2C depicts a trimmed, stacked pillar structure 150 resulting from the etch processing 47 to form the PCM memory device. As shown in FIG. 2C, as a result of the etching process 47, due to the etching process conditions, outside sidewall surfaces of the phase change material layers, e.g., GST layer 30 and OTS material layer 20, become oxidated, leaving thin, damaged oxidized PCM sidewall surface layers 115 of damaged oxidized PCM sidewall surfaces or of reactive ion etch residues resulting from the full stack etch.

In accordance with an embodiment, after the full stack RIE etch, the wafer is transferred in-vacuo (in a vacuum or air-free environment) to a dielectric material deposition process chamber. In the deposition chamber, the structure 150 is subject to an in-situ trim/deposition using Plasma-Enhanced Chemical Vapor Deposition (PECVD) deposition process that allows in-situ selective reactive ion etching (RIE) etch of phase change materials during deposition of dielectric at low temperature (in the same chamber). In such a step, plasma process conditions are such that the thin, damaged oxidized PCM sidewall surface layers 115 of the top and bottom GST layers are simultaneously selectively etched and removed, while the dielectric material layer is deposited to encapsulate the structure. In an embodiment, the encapsulating dielectric material includes a material containing Si, C, B, N or O and is performed at low temperature, e.g., 25° C.-250° C. and more particularly, between 40° C.-200° C. In an embodiment, the encapsulating material to be deposited can include, but is not limited to: SiN, SiOx, SiNOx, SiNC, BN, etc., where x ranges from 0 to 3.

Figure 2D:
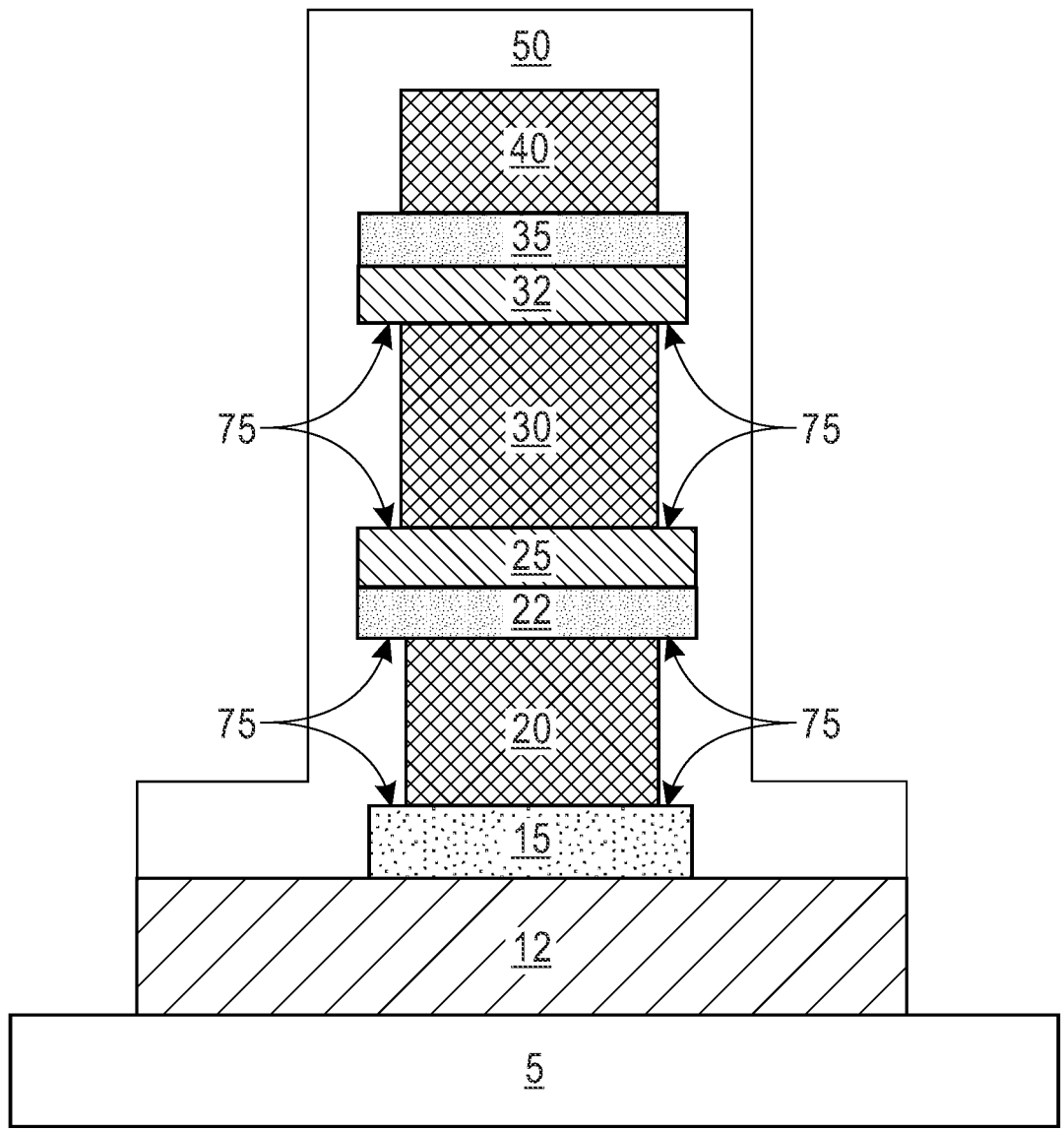

FIG. 2D depicts a final structure 200 resulting from the in-situ trim/deposition using Plasma-Enhanced Chemical Vapor Deposition (PECVD) deposition process. In an embodiment, the method next performs in-situ selective etch/trim of phase change materials during deposition (encapsulation) of dielectric material at low temperature (in the same chamber) without exposure to air. That is, after full stack etch, tuning the plasma conditions, the thin, damaged oxidized PCM sidewall surface layers 115 can be trimmed/etched and the sidewall damage can be removed thereby reducing the width dimension of the resulting PCM materials and forming the undercuts 75 on the top and bottom GST and OTS layers which result from the trimming. Simultaneously therewith, an encapsulating dielectric material layer 50 is deposited at a low temperature all the while maintaining the GST composition with no elemental residue and maintenance of good elemental composition. In an embodiment, the etching is an RIE etch process performed to preferentially etch the GST material while maintaining some selectivity to C, TiN, W, and SiN of other material layers.

Figure 3:
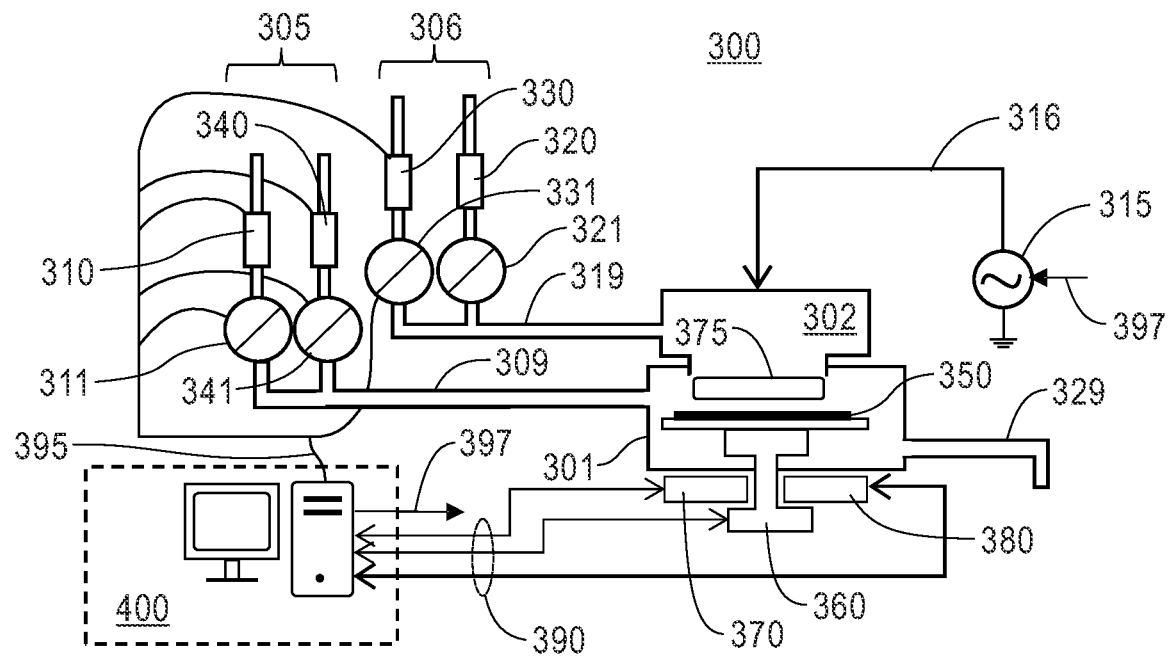
FIG. 3 depicts an exemplary, non-limiting semiconductor fabrication processing apparatus in which the present methods can be employed in an embodiment.

FIG. 3 shows a schematic diagram of an example fabrication apparatus 300 including processing chamber or reactor 301 in which the methods of FIGS. 2A-2D may be implemented. In an embodiment a single processing chamber is shown, although the processing chamber 301 may be one part of a multi-chambered processing system. Apparatus 300 is generally configured to provide deposition process gases, etch gases, and purge gases 305 to a reactor or processing chamber 301, which can be configured as a reduced pressure process chamber ranging from between 1 Torr and 300 Torr during deposition steps and etch steps. One or more gases 305 are input to processing chamber 301 via an inlet gas manifold 309 provided on one side of the processing chamber 301. The same set or another set of gases 306 can be input to apparatus 300 to produce a plasma 375 within a plasma processing chamber 302 located at or within processing chamber 301. Associated with plasma processing chamber 302 is an RF (radio frequency) or microwave frequency signal generator 315 supplying RF or microwave power 316 to the plasma process chamber for creating the plasma 375.

In an embodiment, the process gases 305 are introduced into plasma processing chamber 302 via an inlet gas manifold 319 provided on one side of the process chamber 302 and provided to the reactor 301. An exhaust manifold 329 is provided on the other side of the processing chamber 301 and may be connected to a vacuum pump (not shown) and a scrubber (not shown). An electrostatic chuck and or susceptor 360 is located in the process chamber 302 that is configured to hold a wafer 350 including at least the physical structures shown in FIGS. 2B-2D that are being processed within the plasma processing chamber 302.

In an embodiment, the exemplary apparatus can be configured to provide carrier gases to the process chamber 301, e.g., through gas flow controllers 310, 320, 330, 340 and respective valve 311, 321, 331, 341. The valves 311, 321, 331, 341 can be normally closed and can be opened when the carrier gas flows into the processing chamber 301 or plasma processing chamber 302. Each gas flow controller 310, 320, 330, 340 controls the flow rate of the carrier gas into the processing chamber 301 or plasma processing chamber 302. In one embodiment, the gas flow controllers 310-340 can be configured to provide a flow rate in a range from standard cubic centimeters per minute (sccm) to standard liters per minute (slm). The carrier gas can be, for example, hydrogen gas, nitrogen gas, argon gas, or a combination thereof.

In an embodiment, the exemplary apparatus can be configured to provide process gases that can include precursors such as a silane gas $SiH_4$ that is provided into the processing chamber 301 or plasma processing chamber 302 through one of the gas flow controllers and an associated valve from a silane source. A further gas, diborane $B_2H_6$ is provided into the processing chamber 301 or plasma processing chamber 302 through a further gas flow controller and a corresponding associated valve from a diborane gas source.

As shown in FIG. 3, the apparatus 300 can further include temperature controller 370 and pressure controller 380 to ensure target temperatures and pressures within the exemplary process chamber 301 are achieved.

As further shown in FIG. 3, the exemplary process chamber 301 can further include a process control device 400, which can be a computer, a set of interconnected computers, a dedicated standalone computing device, a portable computing device, or any other type of device capable of generating control signals 390 and receiving feedback signals used for controlling the pressure and temperature of the processing chamber 301 and further, generating signals 395 for controlling the respective gas flows into the processing chamber 301 and plasma processing chamber 302, e.g., by activating each of the valves (311, 321, 331, 341) and respective gas flow controllers (310, 320, 330, 340). Further control signals 397 are generated and applied to the RF generator for controlling frequency and power conditions for generating the plasma 375.

In accordance with embodiments herein, the wafer 350 containing formed resistive memory storage device(s) of FIG. 2C is placed within the apparatus 300 and is transferred, under vacuum (air-free) conditions, from a prior etching chamber, to the processing chamber 301 in which the encapsulating dielectric material is deposited while controlling conditions to trim, by plasma etching, the damaged oxidized sidewall surfaces of GST layers.

In an embodiment, process control device 400 further generates control signals for tuning plasma parameters used to generate, inside the process chamber 301, a plasma 375 to accomplish the processes described including simultaneous deposition and etching as described herein.

By tuning plasma parameters, there is generated a plasma 375 providing for simultaneous in-situ: selective etch of damaged oxidized GST PCM sidewalls and control of the dielectric material (e.g., SiN) deposition. Particularly, the tuning parameters are controlled such as to generate a plasma 375 having a chemistry and other plasma properties for simultaneous encapsulating of deposition dielectric material and perform etching and removal of oxides (trimming) from GST material layers. The depositing of encapsulating dielectric material is performed under low temperature conditions ranging from between 40° C.-200° C. Low temperature dielectric deposition can be used for low temperature budget integration schemes. A chemistry precursor can include gases such as, but not limited to: $SiH_4$, $B_2H_6$, . . . , etc., and the carrier gases including, but not limited to: $H_2$, $N_2$, . . . etc. for generating the plasma 375.

For example, plasma tuning conditions for controlling parameters such as RF or microwave powers, frequency, gas flows and chemistry, and plasma pressures are configured to create the plasma 375 for depositing an encapsulating dielectric material and an etching of damaged oxidized sidewall surfaces of GST layers of the resistive memory storage device structure in the same processing chamber, e.g., of a semiconductor fabrication system without exposing the resistive memory storage structure to air between the steps of plasma etching and deposition.

Figure 4:
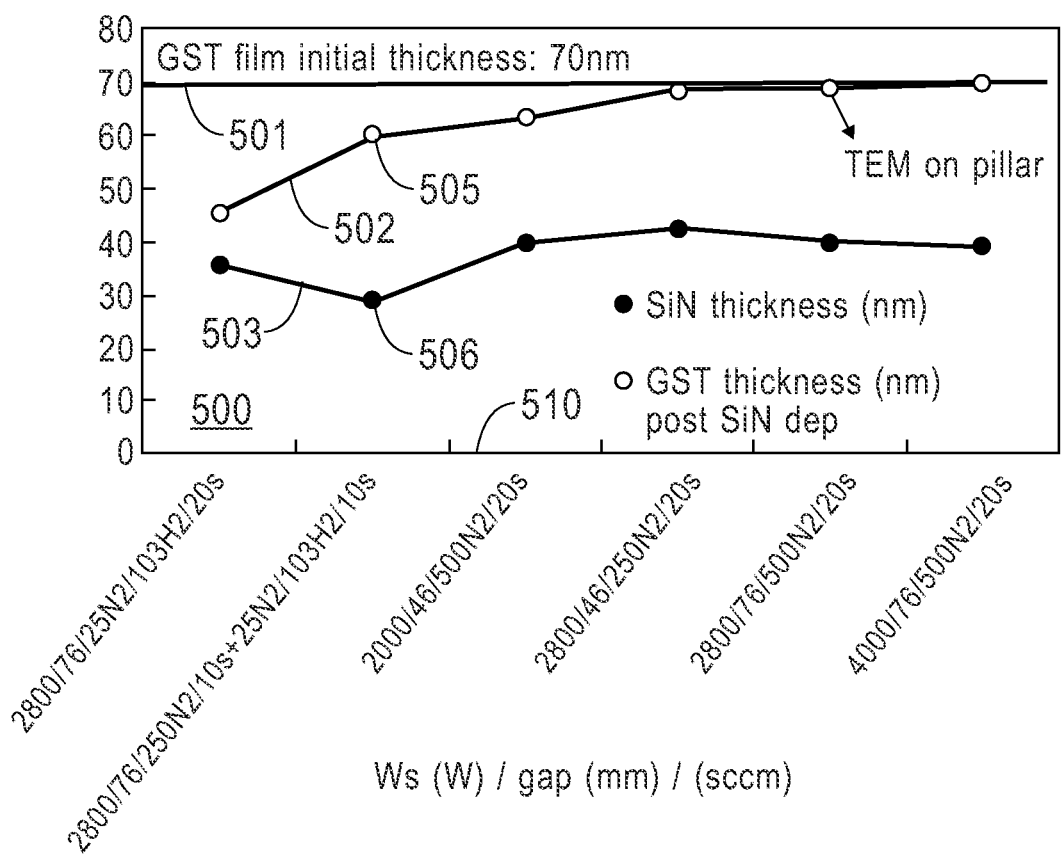
FIG. 4 depicts an example plot showing the tuning of the plasma parameters for simultaneously selectively trimming phase-change material layers to remove sidewall oxidation damage and controlling encapsulation of dielectric material layers deposition.

One illustrative and non-limiting plasma recipe that is useful for etching the damaged oxidation sidewalls at the GST, OTS layers while depositing encapsulating dielectric material around the whole structure include, but is not limited to: RF or Microwave frequency Power (e.g., 2000-4000 Watts), oxygen, nitrogen process flows in sccm, silane, diborane precursors; Pressure (e.g., 50-150 mTorr), plasma volume, etc., FIG. 4 depicts an example plot showing the tuning of the plasma parameters for simultaneously selectively etching phase-change material (e.g., GST) sidewall oxidation damage and controlling encapsulation of dielectric material (e.g., SiN) layer deposition. As shown in FIG. 4, the thickness of the GST (in nm) is plotted along the Y-axis as a function of various PECVD tuning parameters depicted across the X-axis including, for example, a source power of the RF or microwave signal, a distance of the gap between wafer and electrode, and gas flow in sccm. In an embodiment, the RF or microwave frequency power signal can range from 2000 W-4000 W power; the pressure can range from between 50-150 mTorr; and the gap can range from between 46 nm-76 nm. As shown in FIG. 4, depending upon the particular PECVD tuning parameters depicted, in plot 502 there are instances 505 where the GST thickness is decreased (sidewall trimmed) relative to an initial thickness 501 of the GST material layer. The thickness 506 of the encapsulating material (e.g., SiN) is also shown relative to the thickness of the resulting GST film layers for the same tuning parameter condition 510.

The process of the present disclosure can be used for development of a 3D cross-point based resistive memory technology. In an embodiment, this method can be used whenever air exposure between etch and encapsulation is not preferred.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a resistive memory semiconductor device comprising:
   providing, within a processing chamber, a semiconductor wafer including a trimmed resistive memory device structure having one or more layers of phase change material used to form the resistive memory device, said one or more layers of phase change material having oxidized sidewall surfaces; and
   encapsulating said trimmed resistive memory device structure by depositing, within the processing chamber, a layer of dielectric material, and during said encapsulating, simultaneously etching, within the processing chamber, said wafer to selectively remove the oxidized sidewall surfaces of all the one or more layers of said phase change material, wherein said depositing comprises using a plasma enhanced deposition process; and
   during said simultaneously etching and depositing: tuning processing parameters for generating a plasma used to selectively etch said oxidized sidewall surfaces of all the one or more layers of said phase change material and for controlling said depositing a layer of dielectric material.

2. The method of claim 1, wherein said etching to selectively remove said oxidized sidewall surfaces of said phase change material results in a reduced critical dimension thickness of each said one or more layers of phase change material.

3. The method of claim 1, wherein said depositing of encapsulating dielectric material is performed in said processing chamber under a low temperature condition.

4. The method of claim 1, wherein said processing chamber is an air-free environment.

5. The method of claim 1, wherein each said one or more phase change material layers is a chalcogenide-based material having a composition maintained after said etching.

6. A stacked semiconductor resistive memory device structure comprising:
   a bottom electrode;
   an organic material layer formed above said bottom electrode;
   a switching material layer formed above said organic material layer, wherein said switching material layer includes undercut portions beneath said first intermediate barrier layer and undercut portions above said organic material layer formed above said bottom electrode;
   a first intermediate barrier layer formed above said switching material layer, said first intermediate barrier layer comprising:
     a first organic material layer located above said switching material layer and a first metal-containing material layer above said first organic material layer;

a phase change material layer formed above said first intermediate barrier layer;

a second intermediate barrier layer formed above said phase change material layer, said phase change material layer including undercut portions beneath said second intermediate barrier layer and undercut portions above said first intermediate barrier layer, said second intermediate barrier layer comprising:

a second metal-containing material layer disposed above said phase change material layer and a second organic material layer disposed above said second metal-containing material layer;

a top electrode formed above said second intermediate barrier layer, wherein a width of said switching material layer and a width of said phase change material layer is reduced relative to a width of each said first intermediate barrier layer and a width of said second intermediate barrier layer, a dielectric material layer of a single, uniform composition encapsulating said top electrode, said second intermediate barrier layer, said phase change material layer, said first intermediate barrier layer, said switching material layer and said organic material layer, wherein both said switching material layer and said phase change material layer includes sidewalls, said switching material layer and said phase change material layer sidewalls comprising thicker encapsulation dielectric material layer portions than the remaining portions of said dielectric material layer of said single, uniform composition encapsulating top electrode, said second intermediate barrier layer, said first intermediate barrier layer, and said organic material layer.

7. The stacked semiconductor resistive memory device of claim 6 wherein said phase change material is a chalcogenide-based material composition.

8. The stacked semiconductor resistive memory device of claim 6, wherein said switching material layer is an ovonic threshold switch.

9. A semiconductor memory device comprising:

a bottom electrode;

an organic material layer formed above said bottom electrode;

a phase change memory (PCM) cell;

an access device for enabling read or write access to said PCM cell, said access device formed above said organic material layer, wherein a width of said PCM cell and a width of said access device is reduced relative to a width of said organic material layer; and a barrier layer disposed between said PCM cell and access device, wherein said barrier layer disposed between said PCM cell and access device comprises:

a first organic material layer located above said access device and a first metal-containing material layer above said first organic material layer; and a further barrier layer formed above said PCM cell; and a top electrode formed above said further barrier layer, said further barrier layer disposed between said PCM cell and said top electrode comprising:

a second metal-containing material layer disposed above said PCM cell and a second organic material layer disposed above said second metal-containing material layer, wherein a width of said PCM cell and a width of said access device is reduced relative to a width of said barrier layer and a width of said further barrier layer; and a dielectric material layer of a single, uniform composition encapsulating said top electrode, said further barrier layer, said PCM cell, said barrier layer, said access device and said organic material layer, wherein both said access device and said PCM cell includes sidewalls, wherein said access device and said PCM cell sidewalls comprise thicker encapsulation dielectric material layer portions than the remaining portions of said dielectric material layer of said single, uniform composition encapsulating said top electrode, said barrier layer, said further barrier layer and said organic material layer.

* * * * *